US009660664B1

(12) United States Patent
Price et al.

(10) Patent No.: US 9,660,664 B1
(45) Date of Patent: May 23, 2017

(54) GENERATING ASYNCHRONOUS CLOCK SIGNALS FOR SUCCESSIVE APPROXIMATION REGISTER (SAR) ANALOG TO DIGITAL CONVERTERS (ADCS)

(71) Applicant: QUALCOMM Incorporated, San Diego, CA (US)

(72) Inventors: Burt Lee Price, Apex, NC (US); Dhaval Rajeshbhai Shah, Raleigh, NC (US); Yeshwant Nagaraj Kolla, Wake Forest, NC (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/191,966

(22) Filed: Jun. 24, 2016

(51) Int. Cl.
  H03M 1/38 (2006.01)
  H03M 1/46 (2006.01)
(52) U.S. Cl.
  CPC .................. *H03M 1/462* (2013.01)
(58) Field of Classification Search
  CPC .......... H03M 1/08; H03M 1/38; H03M 1/466; H03M 1/125; H03M 1/12; H03M 1/462; H04B 1/7075; H04L 27/0014; H04L 2027/0036
  USPC .................. 341/155–161; 375/130, 327, 340
  See application file for complete search history.

(56) References Cited

U.S. PATENT DOCUMENTS

| 7,576,678 | B2 | 8/2009 | Chatal et al. | |
|---|---|---|---|---|
| 8,344,925 | B1 | 1/2013 | Evans | |
| 8,362,940 | B2 | 1/2013 | Yoshioka | |
| 2007/0189360 | A1* | 8/2007 | Mobin | H04B 1/7075 375/130 |
| 2012/0032824 | A1* | 2/2012 | Yoshioka | H03L 7/0812 341/110 |
| 2013/0057424 | A1* | 3/2013 | Jeon | H03M 1/462 341/156 |
| 2013/0285844 | A1* | 10/2013 | Lin | H03M 1/12 341/110 |
| 2014/0022105 | A1* | 1/2014 | Chen | H03M 1/38 341/161 |
| 2014/0176102 | A1 | 6/2014 | Tang et al. | |
| 2015/0280728 | A1 | 10/2015 | Singh et al. | |

(Continued)

*Primary Examiner* — Lam T Mai
(74) *Attorney, Agent, or Firm* — Peter Michael Kamarchik; Kenneth Vu

(57) ABSTRACT

Aspects of generating asynchronous clock signals for successive approximation register (SAR) analog to digital converters (ADCs) are disclosed. In one aspect, an asynchronous clock generator circuit is provided that is configured to receive a voltage generated by a comparator in a SAR ADC, and generate an outside-window signal in response to the voltage being outside of a voltage threshold window. The asynchronous clock generator circuit is configured to generate a trigger signal in response to the outside-window signal coinciding with the asynchronous clock signal being in an inactive state. In response to the trigger signal being in an active state for a minimum time, the asynchronous clock generator circuit is configured to generate an edge signal, and generate the asynchronous clock signal having a pulse width in response to the edge signal. The asynchronous clock generator circuit adaptively generates the asynchronous clock signal according to timing of each comparison.

30 Claims, 9 Drawing Sheets

(56) References Cited

U.S. PATENT DOCUMENTS

2016/0254821 A1* 9/2016 Luo .................. H03M 1/125
  341/161

* cited by examiner

GENERATING ASYNCHRONOUS CLOCK SIGNALS FOR SUCCESSIVE APPROXIMATION REGISTER (SAR) ANALOG TO DIGITAL CONVERTERS (ADCS)

BACKGROUND

I. Field of the Disclosure

The technology of the disclosure relates generally to successive approximation register (SAR) analog to digital converters (ADCs), and particularly to clocking SAR ADCs with asynchronous clock signals.

II. Background

Processor-based systems employ analog to digital conversion of signals in connection with performing various functions. One way to achieve such analog to digital conversion is by using a successive approximation register (SAR) analog to digital converter (ADC). The operation of a SAR ADC involves performing successive comparisons of an input voltage signal to a series of generated analog signals during the conversion process. A SAR ADC uses the result of each comparison of the input voltage signal to the generated analog signals to generate a final value of a digital signal.

For example, in a SAR ADC, to convert an input voltage signal to a digital signal, each bit of the digital signal is initially set to a logic low "0" state during a first clock cycle of a clock signal during the conversion process. While still in the first cycle of the clock signal during the conversion process, the SAR ADC sets the most significant bit of the digital signal to a logic high "1" state, but leaves all remaining bits of the digital signal at a logic low "0" state. The SAR ADC converts the updated digital signal to a generated analog signal and compares the input voltage signal to the generated analog signal. If the generated analog signal has a voltage greater than the input voltage signal, the SAR ADC changes the most significant bit from a logic high "1" state to a logic low "0" state. Conversely, if the generated analog signal has a voltage less than the input voltage signal, the SAR ADC leaves the most significant bit set to a logic high "1" state. The SAR ADC successively sets each bit of the digital signal and compares the corresponding generated analog signal to the input voltage signal in this manner during each corresponding clock cycle during the conversion process. Thus, following the final clock cycle of the clock signal during the conversion process, the digital signal generated by the SAR ADC is a digital representation of the input voltage signal.

In this example, the clock signal that clocks the SAR ADC has a synchronous, constant period. As a result, each clock cycle corresponding to the conversion process uses the same amount of time to perform the corresponding comparison. However, the SAR ADC completes each comparison in a time that is inversely related to a voltage difference between the input voltage signal and the generated analog signal. In other words, the SAR ADC completes a comparison in less time when the voltage difference is larger compared to the amount of time to complete a comparison when voltage difference is smaller. Therefore, clocking the SAR ADC using a synchronous clock signal causes some cycles of the conversion process to consume excess time that is not used for generating the digital signal.

SUMMARY OF THE DISCLOSURE

Aspects disclosed herein include generating asynchronous clock signals for successive approximation register (SAR) analog to digital converters (ADCs). To convert an analog signal to a digital signal, a SAR ADC performs successive comparisons of the analog signal against a series of internally generated analog signals. The SAR ADC uses the result of each comparison in generating a final value for the digital signal. The amount of time consumed for each comparison is inversely related to the voltage difference between the compared signals. In aspects disclosed herein, an asynchronous clock generator circuit for generating an asynchronous clock signal for a SAR ADC is provided. The asynchronous clock generator circuit is configured to receive a voltage signal generated by a comparator in a SAR ADC, and generate an outside-window signal in response to the voltage signal being outside of a voltage threshold window. The voltage signal being outside of the voltage threshold window indicates that the comparator has completed the current comparison. The asynchronous clock generator circuit is further configured to generate a trigger signal in response to the outside-window signal coinciding with the asynchronous clock signal being in an inactive state. In response to the trigger signal being in an active state for a minimum time, the asynchronous clock generator circuit is configured to generate an edge signal. Generating the edge signal based on such a minimum time avoids generating the edge signal in response to a glitch of the trigger signal. The asynchronous clock generator circuit is further configured to generate the asynchronous clock signal having a pulse width in response to the edge signal. In this manner, the asynchronous clock generator circuit adaptively generates the asynchronous clock signal according to the timing of each corresponding comparison performed by the comparator in the SAR ADC. Thus, a SAR ADC clocked by the asynchronous clock signal experiences an increase in performance compared to using a synchronous clock, because the asynchronous clock signal causes the SAR ADC to provide less time for faster comparisons as opposed to providing a longer, fixed time.

In this regard in one aspect, an asynchronous clock generator circuit for generating an asynchronous clock signal for a SAR ADC is disclosed. The asynchronous clock generator circuit comprises a clock initiation circuit. The clock initiation circuit comprises an outside-window comparator circuit configured to receive an output voltage signal generated by a comparator circuit in a SAR ADC, and generate an outside-window signal in response to the output voltage signal being outside of a voltage threshold window. The clock initiation circuit further comprises a trigger circuit configured to generate a trigger signal in response to the outside-window signal and an asynchronous clock signal. The asynchronous clock generator circuit further comprises a clock generation circuit. The clock generation circuit comprises an edge delayer circuit configured to generate an edge signal in response to the trigger signal being in an active state for a minimum time. The clock generation circuit further comprises a pulse generator circuit. The pulse generator circuit is configured to generate the asynchronous clock signal having a pulse width in response to the edge signal.

In another aspect, an asynchronous clock generator circuit for generating an asynchronous clock signal for a SAR ADC is disclosed. The asynchronous clock generator circuit comprises a means for receiving an output voltage signal generated by a comparator circuit in a SAR ADC. The asynchronous clock generator circuit further comprises a means for generating an outside-window signal in response to the output voltage signal being outside of a voltage threshold window. The asynchronous clock generator circuit further comprises a means for generating a trigger signal in response to the outside-window signal and an asynchronous clock signal. The asynchronous clock generator circuit further comprises a means for generating an edge signal in response to the trigger signal being in an active state for a minimum time. The asynchronous clock generator circuit further comprises a means for generating the asynchronous clock signal having a pulse width in response to the edge signal.

In another aspect, a method for generating an asynchronous clock signal for a SAR ADC is disclosed. The method comprises receiving an output voltage signal generated by a comparator circuit in a SAR ADC. The method further comprises generating an outside-window signal in response to the output voltage signal being outside of a voltage threshold window. The method further comprises generating a trigger signal in response to the outside-window signal and an asynchronous clock signal. The method further comprises generating an edge signal in response to the trigger signal being in an active state for a minimum time. The method further comprises generating the asynchronous clock signal having a pulse width in response to the edge signal.

In another aspect, SAR ADC is disclosed. The SAR ADC comprises a comparator circuit, a digital to analog converter, a SAR circuit configured to be clocked by an asynchronous clock signal, and an asynchronous clock generator circuit. The asynchronous clock generator circuit comprises a clock initiation circuit. The clock initiation circuit comprises an outside-window comparator circuit configured to receive an output voltage signal generated by the comparator circuit, and generate an outside-window signal in response to the output voltage signal being outside of a voltage threshold window. The clock initiation circuit further comprises a trigger circuit configured to generate a trigger signal in response to the outside-window signal and the asynchronous clock signal. The asynchronous clock generator circuit further comprises a clock generation circuit. The clock generation circuit comprises an edge delayer circuit configured to generate an edge signal in response to the trigger signal being in an active state for a minimum time. The clock generation circuit further comprises a pulse generator circuit configured to generate the asynchronous clock signal having a pulse width in response to the edge signal.

DETAILED DESCRIPTION

Figure 1A:
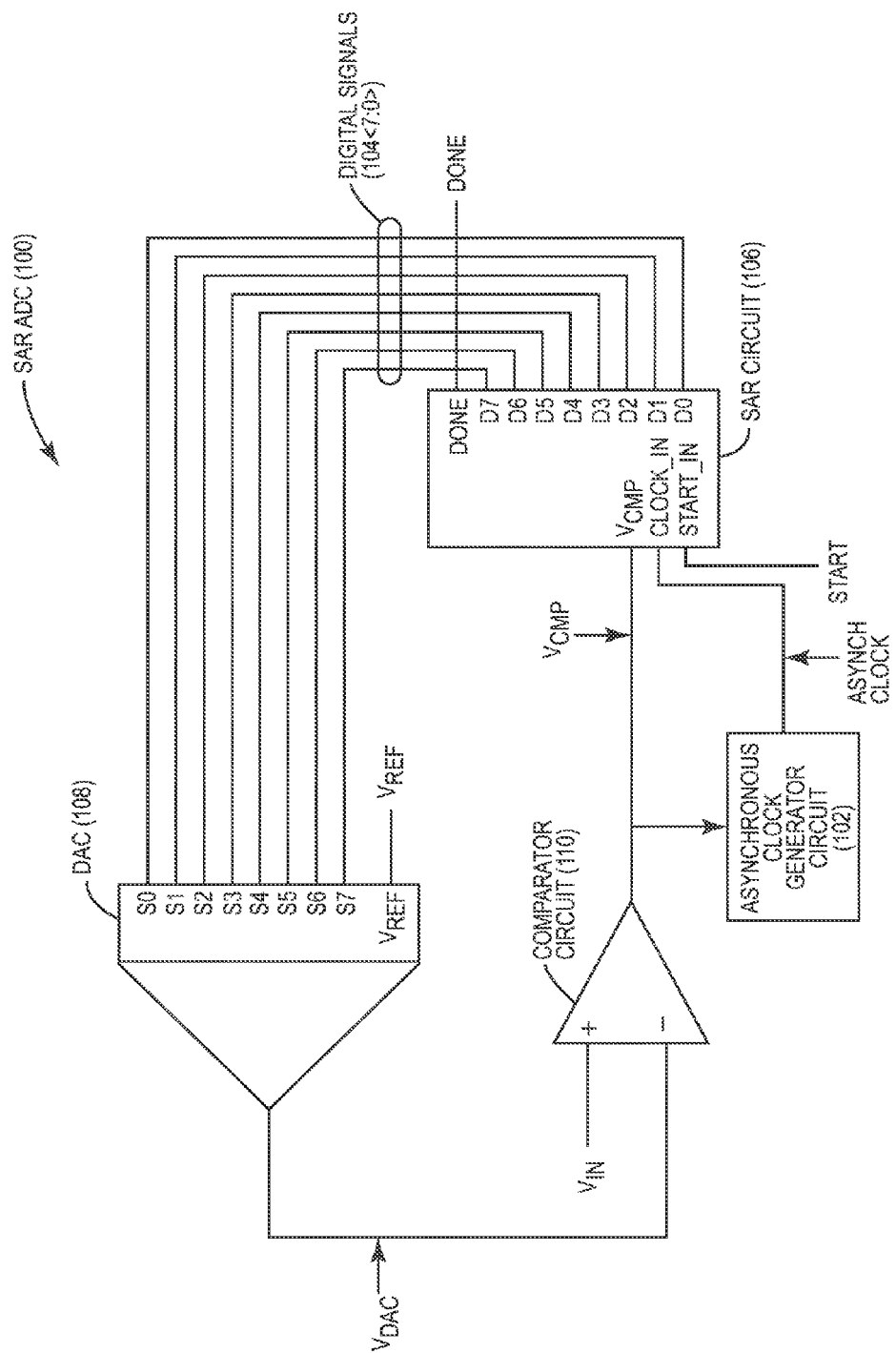
FIG. 1A is a block diagram of an exemplary SAR ADC employing an exemplary asynchronous clock generator circuit for generating an asynchronous clock signal for clocking the SAR ADC.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

FIG. 1A illustrates an exemplary successive approximation register (SAR) analog to digital converter (ADC) 100 employing an exemplary asynchronous clock generator circuit 102 for generating an asynchronous clock signal (ASYNCH CLOCK) for the SAR ADC 100. The SAR ADC 100 is configured to convert an input voltage signal ($V_{IN}$) to digital signals 104<7:0> by performing successive comparisons of the input voltage signal ($V_{IN}$) against a series of generated analog signals during a conversion process. As a non-limiting example, to convert the input voltage signal ($V_{IN}$) into the digital signals 104<7:0>, the SAR ADC 100 begins a conversion process in response to a start signal (START) on a START_IN input activating a SAR circuit 106. In response to a first clock cycle of the asynchronous clock signal (ASYNCH CLOCK) on a CLOCK_IN input during the conversion process, the SAR circuit 106 sets a most significant bit (MSB) of the digital signals 104<7:0> (i.e., digital signal 104(7)) to a logic high "1" state. All remaining bits of the digital signals 104<6:0> are set to a logic low "0" state. In this manner, the digital signals 104<7:0> are set to binary 1000000 (i.e., Decimal 128). The digital signals 104<7:0> are provided from outputs D7-D0 of the SAR circuit 106 to inputs S7-S0 of a digital to analog converter (DAC) 108.

With continuing reference to FIG. 1A, during the first clock cycle of the conversion process, the DAC 108 generates a DAC output voltage signal ($V_{DAC}$) using the equation (digital signals $104<7:0>/2^N)*(V_{REF})$, where ($V_{REF}$) is a reference voltage of the SAR ADC 100, and N is equal to the number of bits in the digital signals 104<7:0>. Thus, the DAC 108 multiplies the reference voltage ($V_{REF}$) by ($128/2^8$) (i.e., (128/256)) such that the DAC output voltage signal ($V_{DAC}$) has a voltage equal to ½ of the reference voltage ($V_{REF}$). While still in the first clock cycle of the conversion process, a comparator circuit 110 receives the DAC output voltage signal ($V_{DAC}$) and the input voltage signal ($V_{IN}$), and generates an output voltage signal ($V_{CMP}$). In this example, the output voltage signal ($V_{CMP}$) has a logic high "1" state if the input voltage signal ($V_{IN}$) has a voltage greater than the voltage of the DAC output voltage signal ($V_{DAC}$), and a logic low "0" state if the input voltage signal ($V_{IN}$) has a voltage less than the voltage of the DAC output voltage signal ($V_{DAC}$).

In response to a second clock cycle of the asynchronous clock signal (ASYNCH CLOCK), the bit of the digital signals 104<7:0> corresponding to the first clock cycle (i.e., digital signal 104(7)) is set to the state of the output voltage signal ($V_{CMP}$). Additionally, the next bit of the digital signals 104<7:0> (i.e., digital signal 104(6)) is set to a logic high "1" state while all remaining bits of the digital signals 104<5:0> are set to a logic low "0" state. For example, if the output voltage signal ($V_{CMP}$) generated in the first clock cycle is logic high "1," the digital signal 104(7) and the digital signal 104(6) are both logic high "1," while the remaining digital signals 104<5:0> are logic low "0" (e.g., binary 1100000, or Decimal 192). The DAC 108 generates an updated DAC output voltage signal ($V_{DAC}$) corresponding to the second clock cycle, and the comparator circuit 110 generates an updated output voltage signal ($V_{CMP}$). In response to a third clock cycle of the asynchronous clock (ASYNCH CLOCK), the bit of the digital signals 104<7:0> corresponding to the second clock cycle (i.e., digital signal 104(6)) is set to the state of the output voltage signal ($V_{CMP}$), and the process continues until the value of each bit of the digital signals 104<7:0> has been determined. Following the conversion process, the digital signals 104<7:0> are a digital representation of the input voltage signal ($V_{IN}$), and the SAR ADC 100 generates a done signal (DONE) indicating the conversion process is complete.

With continuing reference to FIG. 1A, the comparator circuit 110 generates the output voltage signal ($V_{CMP}$) in a time that is inversely related to a voltage difference ($V_{DIFF}$) between the input voltage signal ($V_{IN}$) and the DAC output voltage signal ($V_{DAC}$). In other words, the comparator circuit 110 generates the output voltage signal ($V_{CMP}$) in less time when the voltage difference ($V_{DIFF}$) is larger compared to the amount of time to generate the output voltage signal ($V_{CMP}$) when voltage difference ($V_{DIFF}$) is smaller. As a non-limiting example, if a synchronous clock signal is used to clock the SAR ADC 100, some cycles of the conversion process will consume excess time that is not used for generating the digital signals 104<7:0>. In contrast, to take advantage of the comparator circuit 110 generating the output voltage signal ($V_{CMP}$) in less time when the voltage difference ($V_{DIFF}$) is larger, the asynchronous clock generator circuit 102 is configured to adaptively generate the asynchronous clock signal (ASYNCH CLOCK) according to the timing of each corresponding comparison performed by the comparator circuit 110 in the SAR ADC 100. Thus, employing the asynchronous clock signal (ASYNCH CLOCK) allows the SAR ADC 100 to complete the conversion process more quickly compared to providing a synchronous clock signal.

Figure 1B:
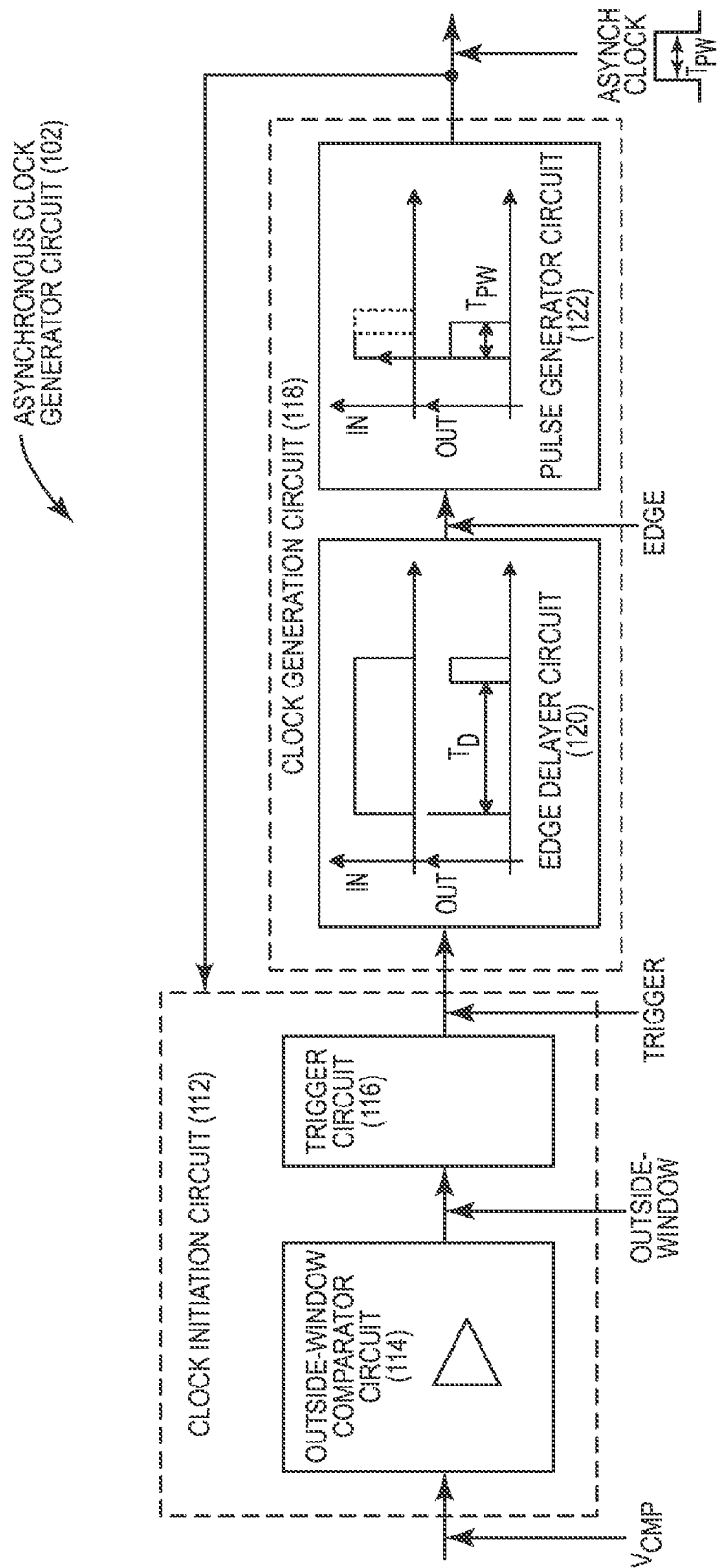
FIG. 1B is a block diagram illustrating more exemplary details of the asynchronous clock generator circuit in the SAR ADC in FIG. 1A.

In this regard, with reference to FIG. 1B, the asynchronous clock generator circuit 102 includes a clock initiation circuit 112. The clock initiation circuit 112 is configured to initiate generation of the asynchronous clock signal (ASYNCH CLOCK). The clock initiation circuit 112 includes an outside-window comparator circuit 114 configured to receive the output voltage signal ($V_{CMP}$) generated by the comparator circuit 110, and generate an outside-window signal (OUTSIDE-WINDOW) in response to the output voltage signal ($V_{CMP}$) being outside of a voltage threshold window (VTW). The output voltage signal ($V_{CMP}$) being outside of the voltage threshold window indicates that the comparator circuit 110 has completed the comparison corresponding to the current clock cycle of the asynchronous clock signal (ASYNCH CLOCK). Further, the clock initiation circuit 112 includes a trigger circuit 116 configured to generate a trigger signal (TRIGGER) in response to the outside-window signal (OUTSIDE-WINDOW) and the asynchronous clock signal (ASYNCH CLOCK). For example, in this aspect, the trigger signal (TRIGGER) is generated in response to the outside-window signal (OUTSIDE-WINDOW) being in an active state and the asynchronous clock signal (ASYNCH CLOCK) being in an inactive state. Thus, if the asynchronous clock signal (ASYNCH CLOCK) has completed the most recent clock cycle, the clock initiation circuit 112 is configured to initiate the next cycle of the asynchronous clock signal (ASYNCH CLOCK) in response to the comparator circuit 110 completing a comparison. As described in more detail below, employing the outside-window comparator circuit 114 and the trigger circuit 116 in this manner reduces glitches in the asynchronous clock signal (ASYNCH CLOCK) caused by the metastability of the output voltage signal ($V_{CMP}$).

With continuing reference to FIG. 1B, the asynchronous clock generator circuit 102 also includes a clock generation circuit 118 configured to generate the asynchronous clock signal (ASYNCH CLOCK) based on the trigger signal (TRIGGER). In this manner, the clock generation circuit 118 includes an edge delayer circuit 120. In response to the trigger signal (TRIGGER) being in an active state for a minimum time ($T_D$), the edge delayer circuit 120 is configured to generate an edge signal (EDGE). In this aspect, the edge delayer circuit 120 is configured to increase a time count in response to the trigger signal (TRIGGER) being in an active state, and generate the edge signal (EDGE) in response to the time count equaling the minimum time ($T_D$). However, the edge delayer circuit 120 is also configured to reset the time count in response to the trigger signal (TRIGGER) transitioning to an inactive state. By resetting the time count in this manner, the edge delayer circuit 120 avoids generating the edge signal (EDGE) in response to multiple short glitches in the trigger signal (TRIGGER). Thus, as described in more detail below, generating the edge signal (EDGE) based on the minimum time ($T_D$) time avoids generating the edge signal (EDGE) in response to a glitch of the trigger signal (TRIGGER).

Additionally, the clock generation circuit 118 includes a pulse generator circuit 122 configured to generate the asynchronous clock signal (ASYNCH CLOCK) having a pulse width ($T_{PW}$) in response to the edge signal (EDGE). In this manner, the asynchronous clock generator circuit 102 adaptively generates the asynchronous clock signal (ASYNCH CLOCK) according to the timing of each corresponding comparison performed by the comparator circuit 110 in the SAR ADC 100 in FIG. 1A. Thus, clocking the SAR ADC 100 with the asynchronous clock signal (ASYNCH CLOCK) results in an increase in performance of the SAR ADC 100 compared to using a synchronous clock. Such an increase in performance is due to the asynchronous clock signal (ASYNCH CLOCK) causing the SAR ADC 100 to provide less time for faster comparisons as opposed to providing a longer, fixed time.

Figure 2:
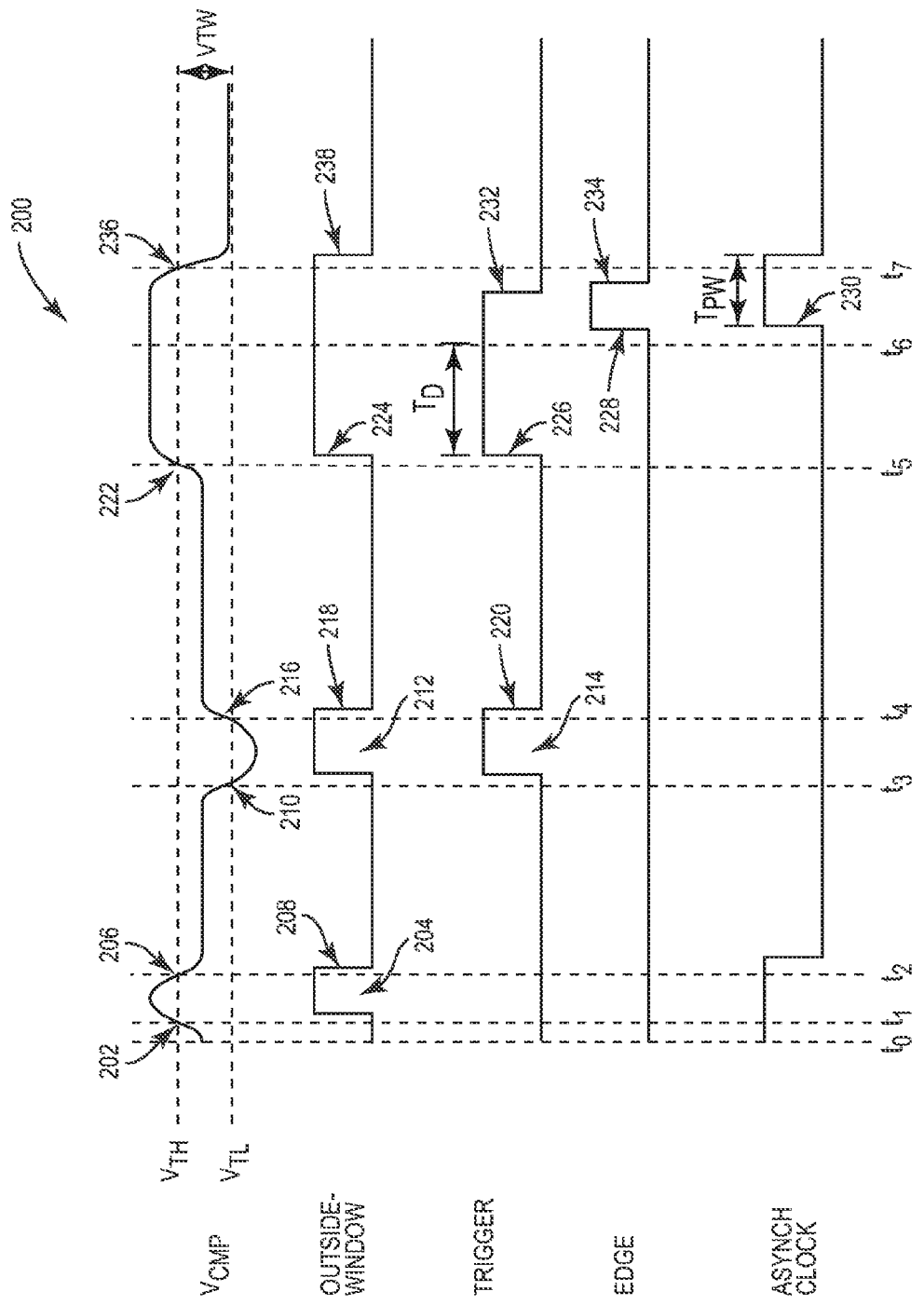
FIG. 2 is a timing diagram illustrating exemplary timings of signals generated by the asynchronous clock generator circuit in FIG. 1B in response to transitions of an output voltage signal of a comparator circuit in the SAR ADC in FIG. 1A.

FIG. 2 provides a timing diagram 200 illustrating exemplary timings of signals of the asynchronous clock generator circuit 102 in FIG. 1B in response to transitions of the output voltage signal ($V_{CMP}$) of the comparator circuit 110 in the SAR ADC 100 in FIG. 1A to facilitate further explanation.

In this example, the voltage threshold window (VTW) has an upper bound of a high threshold voltage ($V_{TH}$) and a lower bound of a low threshold voltage ($V_{TL}$). The outside-window comparator circuit 114 is configured to generate the outside-window signal (OUTSIDE WINDOW) in response to: 1) the output voltage signal ($V_{CMP}$) having a voltage greater than the high voltage threshold ($V_{TH}$), or 2) the output voltage signal ($V_{CMP}$) having a voltage less than the low threshold voltage ($V_{TL}$). Those of ordinary skill in the art will recognize that the outside-window comparator circuit 114 can be implemented by using a conventional window comparator circuit with an inverted output to indicate that the input voltage (e.g., the output voltage signal ($V_{CMP}$)) to the window comparator circuit falls outside of a defined voltage window.

With continuing reference to FIG. 2, at time $t_0$ the output voltage signal ($V_{CMP}$) has a voltage between the high threshold voltage ($V_{TH}$) and the low threshold voltage ($V_{TL}$), and thus, within the voltage threshold window (VTW). At time $t_1$, the output voltage signal ($V_{CMP}$) increases to exceed the high voltage threshold ($V_{TH}$) (arrow 202). In response to the output voltage signal ($V_{CMP}$) increasing at arrow 202, the outside-window comparator circuit 114 generates the outside-window signal (OUTSIDE-WINDOW) with a logic high "1" state (arrow 204). Although the outside-window signal (OUTSIDE-WINDOW) has a logic high "1" state at arrow 204, the trigger circuit 116 does not generate the trigger signal (TRIGGER), because the asynchronous clock signal (ASYNCH CLOCK) has a logic high "1" state. In this example, the increase in the output voltage signal ($V_{CMP}$) at time $t_1$ is attributable to a glitch of the comparator circuit 110, and thus, the output voltage signal ($V_{CMP}$) decreases below the high voltage threshold ($V_{TH}$) to within the voltage threshold window (VTW) at time $t_2$ (arrow 206). In response to the output voltage signal ($V_{CMP}$) falling within the voltage threshold window (VTW), the outside-window comparator circuit 114 causes the outside-window signal (OUTSIDE-WINDOW) to transition to a logic low "0" state (arrow 208).

With continuing reference to FIG. 2, at time $t_3$ the output voltage signal ($V_{CMP}$) decreases below the low voltage threshold ($V_{TL}$) (arrow 210). In response to the decrease in the output voltage signal ($V_{CMP}$) at arrow 210, the outside-window comparator circuit 114 generates the outside-window signal (OUTSIDE-WINDOW) with logic a high "1" state (arrow 212). Additionally, because the outside-window signal (OUTSIDE-WINDOW) has a logic high "1" state while the asynchronous clock signal (ASYNCH CLOCK) has logic low "0" state, the trigger circuit 116 generates the trigger signal (TRIGGER) with a logic high "1" state (arrow 214). However, in this example, the decrease in the output voltage signal ($V_{CMP}$) at time $t_3$ is attributable to a glitch of the comparator circuit 110, and thus, the output voltage signal ($V_{CMP}$) increases above the low voltage threshold ($V_{TL}$) to within the voltage threshold window (VTW) at time $t_4$ (arrow 216). Consequently, the outside-window signal (OUTSIDE-WINDOW) and the trigger signal (TRIGGER) both transition to a logic low "0" state (arrows 218, 220, respectively). Further, although the asynchronous clock signal (ASYNCH CLOCK) has a logic low "0" state while the trigger signal (TRIGGER) has a logic high "1" state at arrow 214, the trigger signal (TRIGGER) does not have a logic high "1" state for the minimum time ($T_D$). Therefore, the edge delayer circuit 120 does not generate the edge signal (EDGE), and thus, no pulse is generated on the asynchronous clock signal (ASYNCH CLOCK).

With continuing reference to FIG. 2, at time $t_5$ the output voltage signal ($V_{CMP}$) increases to exceed the high voltage threshold ($V_{TH}$) (arrow 222). In response to the output voltage signal ($V_{CMP}$), the outside-window comparator circuit 114 generates the outside-window signal (OUTSIDE-WINDOW) with a logic high "1" state (arrow 224). Additionally, because the outside-window signal (OUTSIDE-WINDOW) has a logic high "1" state while the asynchronous clock signal (ASYNCH CLOCK) has a logic low "0" state, the trigger circuit 116 generates the trigger signal (TRIGGER) with a logic high "1" state (arrow 226). In this example, the output voltage signal ($V_{CMP}$) remains above the high threshold voltage ($V_{TH}$) through time $t_6$, which causes the trigger signal (TRIGGER) to have a logic high "1" state (e.g., an active state) for at least the minimum time ($T_D$). In this aspect, the minimum time ($T_D$) is designed to have as short a duration as possible while still avoiding generating the edge signal (EDGE) in response to the glitches described above. In response to the trigger signal (TRIGGER) being in a logic high "1" state for the minimum time ($T_D$), the edge delayer circuit 120 generates the edge signal (EDGE) (arrow 228). The pulse generator circuit 122 generates the asynchronous clock signal (ASYNCH CLOCK) having the pulse width ($T_{PW}$) in response to the edge signal (EDGE) (arrow 230). As illustrated in FIG. 2, the pulse width ($T_{PW}$) has a shorter duration than the minimum time ($T_D$) in this example. In this manner, the pulse width ($T_{PW}$) can be designed to be shorter than the minimum time ($T_D$) so as to provide the asynchronous clock signal (ASYNCH CLOCK) time to complete a cycle of clocking the SAR ADC 100 in FIG. 1 prior to the edge delayer circuit 120 causing the next cycle.

With continuing reference to FIG. 2, the trigger signal (TRIGGER) transitions to a logic low "0" state in response to the asynchronous clock signal (ASYNCH CLOCK) transitioning to a logic high "1" state (arrow 232). In response to the trigger signal (TRIGGER) transitioning to a logic low "0" state, the edge signal (EDGE) transitions to a logic low "0" state (arrow 234). Additionally, the output voltage signal ($V_{CMP}$) decreases below the high threshold voltage ($V_{TH}$) at time $t_7$ (arrow 236), causing the outside-window signal (OUTSIDE-WINDOW) to transition to a logic low "0" state (arrow 238). In this manner, the asynchronous clock generator circuit 102 adaptively generates the asynchronous clock signal (ASYNCH CLOCK) according to the timing of a comparison performed by the comparator circuit 110 in FIG. 1A, while also avoiding generating glitches caused by the meta-stability issues of the output voltage signal ($V_{CMP}$). In particular, the asynchronous clock generator circuit 102 does not generate the asynchronous clock signal (ASYNCH CLOCK) in response to the output voltage signal ($V_{CMP}$) having a meta-stable state. Rather, the asynchronous clock signal (ASYNCH CLOCK) can be initiated by the output voltage signal ($V_{CMP}$) having a stable state.

Figure 3:
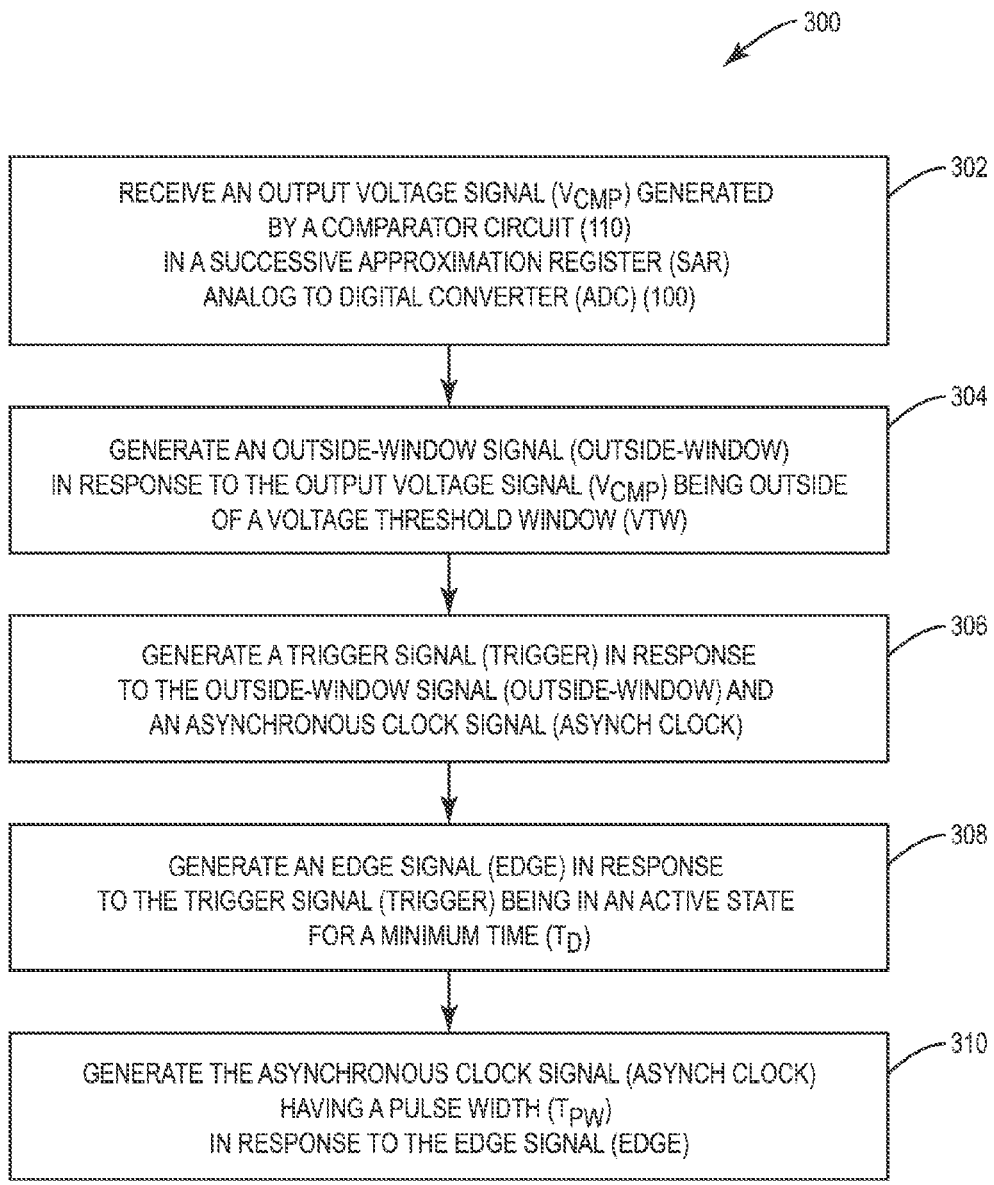
FIG. 3 is a flowchart of an exemplary process for generating the asynchronous clock signal using the asynchronous clock generator circuit in FIG. 1B for clocking the SAR ADC in FIG. 1A.

FIG. 3 illustrates an exemplary process 300 for generating the asynchronous clock signal (ASYNCH CLOCK) using the asynchronous clock generator circuit 102 in FIG. 1B for clocking the SAR ADC 100 in FIG. 1A. The process 300 includes the outside-window comparator circuit 114 receiving the output voltage signal ($V_{CMP}$) generated by the comparator circuit 110 in the SAR ADC 100 in FIG. 1 (block 302). The process 300 also includes the outside-window comparator circuit 114 generating the outside-window signal (OUTSIDE_WINDOW) in response to the output voltage signal ($V_{CMP}$) being outside of the voltage threshold window (VTW) (block 304). Further, the process 300 includes the trigger circuit 116 generating the trigger signal (TRIGGER) in response to the outside-window signal (OUTSIDE-WINDOW) and the asynchronous clock signal (ASYNCH CLOCK) (block 306). Additionally, the process 300 includes the edge delayer circuit 120 generating the edge signal (EDGE) in response to the trigger signal (TRIGGER) being in an active state (e.g., a logic high "1" state) for the minimum time ($T_D$) (block 308). The process 300 further includes the pulse generator circuit 122 generating the asynchronous clock signal (ASYNCH CLOCK) having the pulse width ($T_{PW}$) in response to the edge signal (EDGE) (block 310). Using the process 300, the asynchronous clock generator circuit 102 adaptively generates the asynchronous clock signal (ASYNCH CLOCK) according to the timing of a comparison performed by the comparator circuit 110 in FIG. 1A. Thus, clocking the SAR ADC 100 with the asynchronous clock signal (ASYNCH CLOCK) causes an increase in performance of the SAR ADC 100 compared to using a synchronous clock, because the asynchronous clock signal (ASYNCH CLOCK) causes the SAR ADC 100 to provide less time for faster comparisons as opposed to providing a longer, fixed time.

Figure 4:
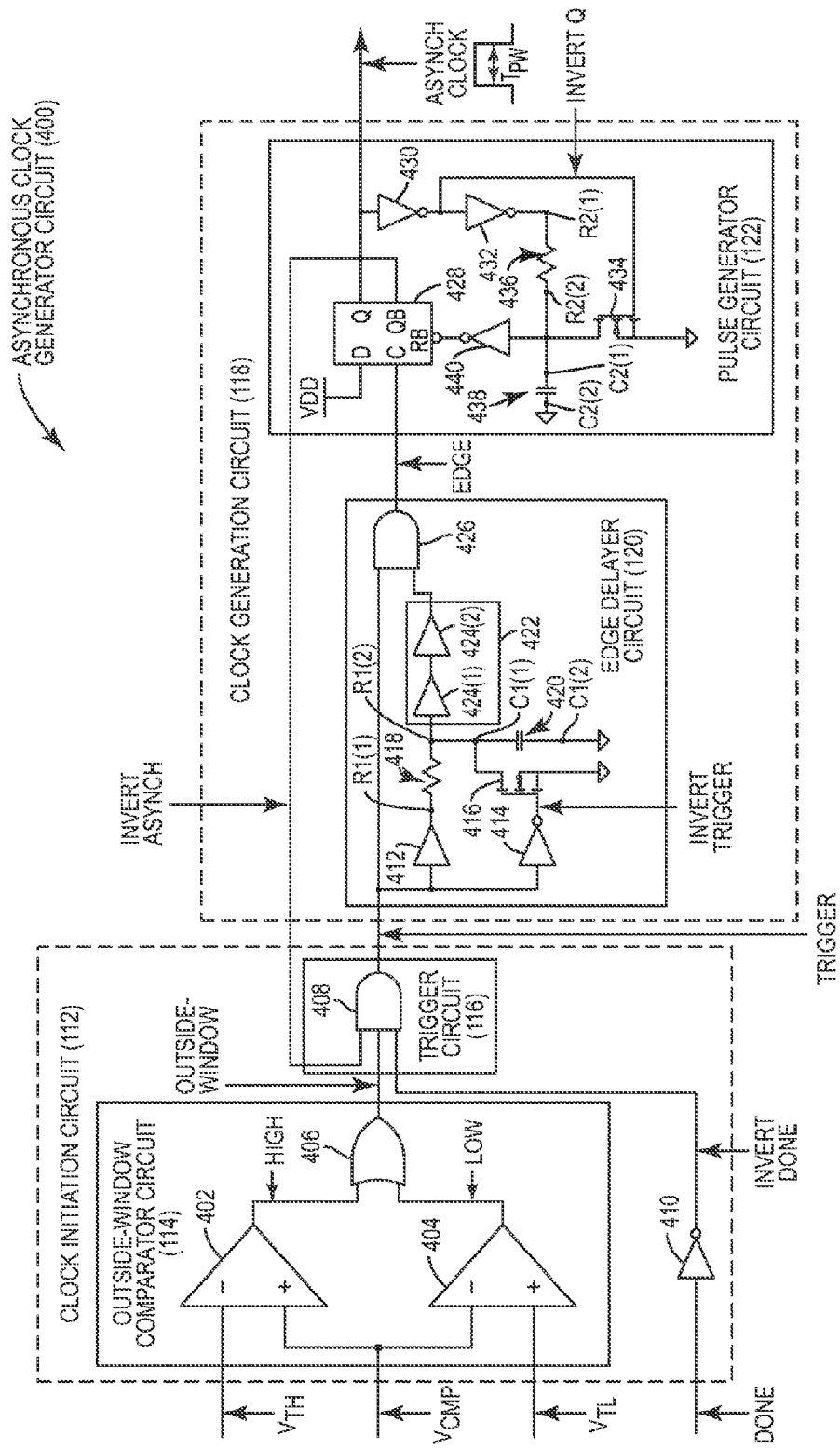
FIG. 4 is a circuit diagram of an exemplary asynchronous clock generator circuit that can be provided in the SAR ADC in FIG. 1A for generating an asynchronous clock signal for clocking the SAR ADC.

Aspects of the asynchronous clock generator circuit described herein, such as the asynchronous clock generator circuit 102 in FIG. 1B, can be implemented using various circuit designs and elements. As a non-limiting example, FIG. 4 illustrates an exemplary asynchronous clock generator circuit 400 for generating the asynchronous clock signal (ASYNCH CLOCK). The asynchronous clock generator circuit 400 can be employed in the asynchronous clock generator circuit 102 in FIG. 1B. The asynchronous clock generator circuit 400 includes certain common components with the asynchronous clock generator circuit 102 in FIG. 1B as shown by common element numbers between FIGS. 1B and 4, and thus will not be re-described herein.

With reference to FIG. 4, the outside-window comparator circuit (114) of the asynchronous clock generator circuit 400 includes a high comparator 402 and a low comparator 404. The high comparator 402 is configured to receive the output voltage signal ($V_{CMP}$) on a positive terminal (+) and the high threshold voltage ($V_{TH}$) on a negative terminal (−). Further, the high comparator 402 is configured to generate a high limit signal (HIGH) in response to the output voltage signal ($V_{CMP}$) having a voltage greater than the high threshold voltage ($V_{TH}$). In contrast, the low comparator 404 is configured to receive the output voltage signal ($V_{CMP}$) on a negative terminal (−) and the low threshold voltage ($V_{TL}$) on a positive terminal (+). The low comparator 404 is configured to generate a low limit signal (LOW) in response to the output voltage signal ($V_{CMP}$) having a voltage less than the low threshold voltage ($V_{TL}$). An OR-based logic circuit 406 (e.g., an OR gate or a NOR gate) employed by the outside-window comparator circuit 114 is configured to receive the high limit signal (HIGH) and the low limit signal (LOW) and generate the outside-window signal (OUTSIDE-WINDOW).

With continuing reference to FIG. 4, the trigger circuit 116 includes an AND-based logic circuit 408 (e.g., an AND gate or a NAND gate) configured to receive the outside-window signal (OUTSIDE-WINDOW) and an inverted asynchronous clock signal (INVERT ASYNCH). Additionally, in this aspect, an inverter 410 is included that is configured to receive the done signal (DONE) from the SAR circuit 106 in FIG. 1A and provide an inverted done signal (INVERT DONE) to the AND-based logic circuit 408. As previously described, the done signal (DONE) indicates that the SAR ADC 100 in FIG. 1A is not performing the conversion process. Conversely, the inverted done signal (INVERT DONE) indicates that the SAR ADC 100 in FIG. 1A is performing the conversion process. In this manner, the AND-based logic circuit 408 is configured to generate the trigger signal (TRIGGER) in response to the outside-window signal (OUTSIDE-WINDOW) being in an active state, the asynchronous clock signal (ASYNCH SIGNAL) being in an inactive state, and the inverted done signal (INVERT DONE) being in an active state (e.g., the done signal being in an inactive state). In other words, the trigger circuit 116 generates the trigger signal (TRIGGER) in response to the comparator circuit 110 in FIG. 1A completing a comparison if the asynchronous clock signal (ASYNCH CLOCK) is currently inactive and the SAR ADC 100 in FIG. 1A is performing the conversion process.

With continuing reference to FIG. 4, the edge delayer circuit 120 includes a buffer 412 and an inverter 414 configured to receive the trigger signal (TRIGGER). The inverter 414 is configured to provide an inverted trigger signal (INVERT TRIGGER) to a gate of an n-type metal oxide semiconductor (NMOS) transistor 416. Further, the buffer 412 is configured to provide the trigger signal (TRIGGER) to a first node R1(1) of a resistor circuit 418 (e.g., a resistor 418 in this aspect). A second node R1(2) of the resistor circuit 418 is electrically coupled to a drain of the NMOS transistor 416, a first node C1(1) of a capacitor circuit 420 (e.g., a capacitor 420 in this aspect), and an input of a gain circuit 422. The first node C1(1) of the capacitor circuit 420 is electrically coupled to the drain of the NMOS transistor 416, and a second node C1(2) of the capacitor circuit 420 is electrically coupled to ground. A source of the NMOS transistor 416 is also electrically coupled to ground. In this manner, in response to the trigger signal (TRIGGER) being in an inactive state (e.g., a logic low "0" state), the inverted trigger signal (INVERT TRIGGER) is in an active state (e.g., a logic high "1" state). The inverted trigger signal (INVERT TRIGGER) activates the NMOS transistor 416 and causes charge stored in the capacitor circuit 420 to discharge to ground. Discharging the capacitor circuit 420 in this aspect functions to reset the time count of the edge delayer circuit 120 such that the edge signal (EDGE) is generated only when the trigger signal (TRIGGER) is continuously in an active state (e.g., a logic high "1" state) for the minimum time ($T_D$).

In contrast, responsive to the trigger signal (TRIGGER) being in an active state (e.g., a logic high "1" state), the buffer 412 provides the trigger signal (TRIGGER) to the resistor circuit 418, causing a current to flow to the second node R1(2) of the resistor circuit 418. Additionally, the inverted trigger signal (INVERT TRIGGER) being in an inactive state (e.g., a logic low "0" state) deactivates the NMOS transistor 416 such that charge from the second node R1(2) of the resistor circuit 418 flows to and is stored in the capacitor circuit 420. In response to the capacitor circuit 420 charging for the minimum time ($T_D$), a voltage corresponding to the resistor-capacitor (RC) circuit formed by the resistor circuit 418 and the capacitor circuit 420 reaches a threshold voltage of a buffer 424(1). The voltage of the RC circuit triggers the buffer 424(1), which then triggers a buffer 424(2) of the gain circuit 422. Consequently, a logic high "1" state is provided to an AND-based logic circuit 426 (e.g., an AND gate or a NAND gate) that is also configured to receive the trigger signal (TRIGGER). Thus, the AND-based logic circuit 426 is configured to generate the edge signal (EDGE) in response to the trigger signal (TRIGGER) being in an active state (e.g., a logic high state "1") for the minimum time ($T_D$). In other words, charging the capacitor circuit 420 corresponds to increasing the time count in response to the trigger signal (TRIGGER) being in an active state. In this manner, the minimum time ($T_D$) of the asynchronous clock generator circuit 400 can be controlled based on an RC delay corresponding to resistance (R) of the resistor circuit 418 and capacitance (C) of the capacitor circuit 420.

With continuing reference to FIG. 4, the pulse generator circuit 122 includes a flip-flop circuit 428 configured to receive a source voltage (VDD) on a data input (D) and the edge signal (EDGE) on a clock input (C). In response to an active transition of the edge signal (EDGE) (e.g., transitioning to a logic high "1" state), the flip-flop circuit 428 is configured to provide the source voltage (VDD) on a data output (Q). In this manner, the edge signal (EDGE) clocks the flip-flop circuit 428 so as to generate the asynchronous clock signal (ASYNCH CLOCK) on the data output (Q), and generates an inverted asynchronous clock signal (INVERT ASYNCH) on a data bar output (QB).

To generate the asynchronous clock signal (ASYNCH CLOCK) having the pulse width ($T_{PW}$), the data from the data output (Q) (e.g., the asynchronous clock signal) is provided to a first inverter 430. The first inverter 430 is configured to provide inverted data (INVERT Q) (e.g., the inverted asynchronous clock signal) to a second inverter 432 and to a gate of an NMOS transistor 434. A source of the NMOS transistor 434 is electrically coupled to ground, while a drain of the NMOS transistor 434 is electrically coupled to a resistor circuit 436 (e.g., a resistor 436 in this aspect), a capacitor circuit 438 (e.g., capacitor 438 in this aspect), and an input of a reset inverter 440.

With continuing reference to FIG. 4, an active state (e.g., a logic high "1" state) of the asynchronous clock signal (ASYNCH CLOCK) causes the inverted data (INVERT Q) to have an inactive state (e.g., a logic low "0" state), which deactivates the NMOS transistor 434. Deactivation of the NMOS transistor 434 decouples the resistor circuit 436, the capacitor circuit 438, and the input of the reset inverter 440 from ground. Further, the second inverter 432 provides a signal equivalent to the asynchronous clock signal (ASYNCH CLOCK) to a first node R2(1) of the resistor circuit 436. A second node R2(2) of the resistor circuit 436 is electrically coupled to a first node C2(1) of the capacitor circuit 438 and the drain of the NMOS transistor 434. Thus, current flows from the second node R2(2) of the resistor circuit 436 to the first node C2(1) of the capacitor circuit 438. A second node C2(2) of the capacitor circuit 438 is electrically coupled to ground. In response to the capacitor circuit 438 charging for a time equivalent to the pulse width ($T_{PW}$), a voltage corresponding to the RC circuit formed by the resistor circuit 436 and the capacitor circuit 438 reaches a threshold voltage of the reset inverter 440. As a result, the reset inverter 440 provides a reset signal being in an inactive state (e.g., a logic low "0" state) to a reset bar input (RB) of the flip-flop circuit 428. The reset signal with an inactive state on the reset bar input (RB) resets the flip-flop circuit 428, driving the asynchronous clock signal (ASYNCH CLOCK) to an inactive state (e.g., a logic low "0" state). Thus, the RC delay of the resistor circuit 436 and the capacitor circuit 438 in the pulse generator circuit 122 controls how long the asynchronous clock signal (ASYNCH CLOCK) generated by the flip-flop circuit 428 remains in an active state (e.g., a logic high "1" state). In this manner, the RC delay of the pulse generator circuit 122 is used to control the pulse width ($T_{pw}$) of the asynchronous clock signal (ASYNCH CLOCK).

Figure 5:
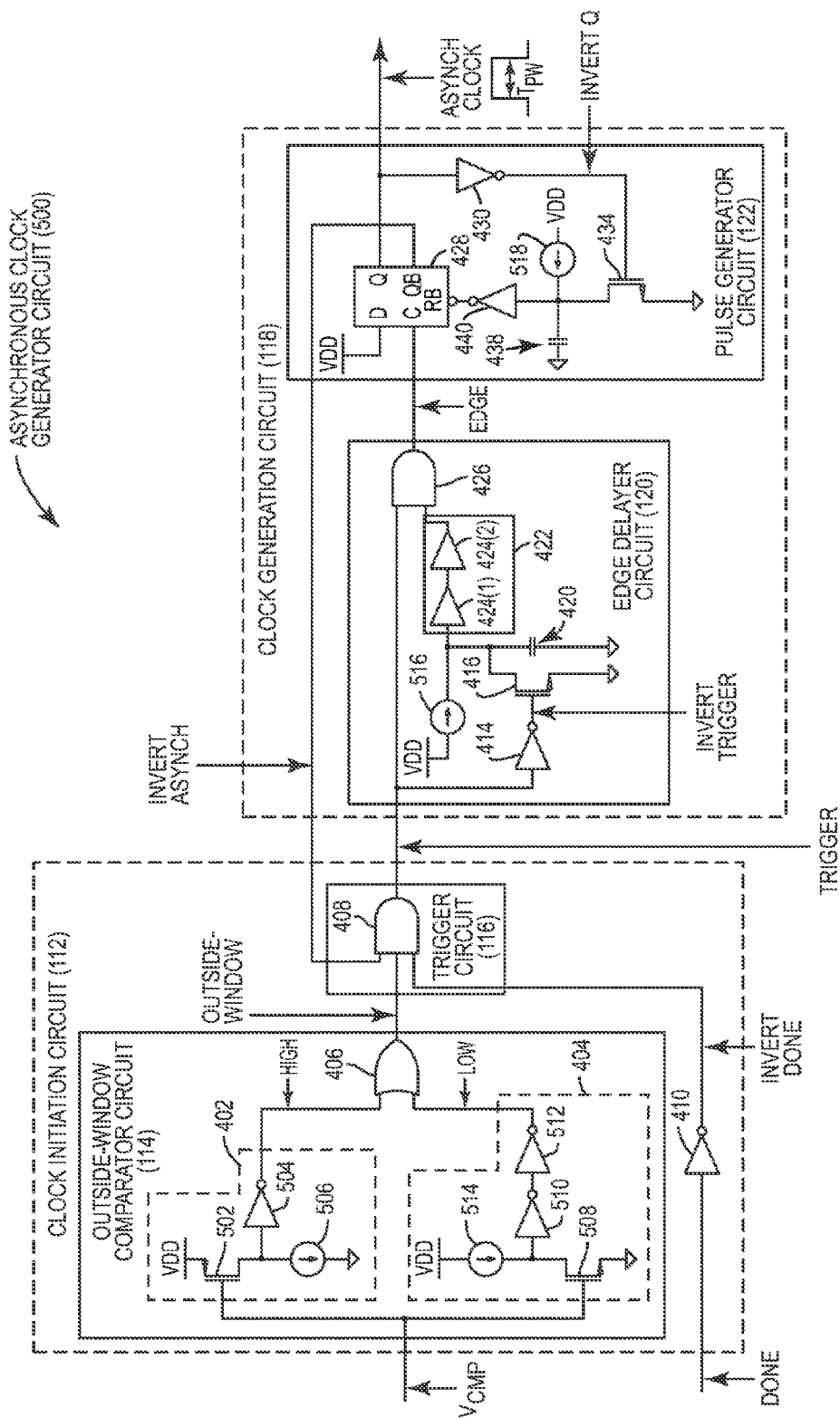
FIG. 5 is a circuit diagram of another exemplary asynchronous clock generator circuit that can be provided in the SAR ADC in FIG. 1A for generating an asynchronous clock signal for clocking the SAR ADC.

In addition to the aspect illustrated in FIG. 4, other aspects of the asynchronous clock generator circuit described herein can include alternative circuit elements while still achieving similar functionality. As a non-limiting example, FIG. 5 illustrates another exemplary asynchronous clock generator circuit 500 for generating the asynchronous clock signal (ASYNCH CLOCK). The asynchronous clock generator circuit 500 can be employed in the asynchronous clock generator circuit 102 in FIG. 1B. The asynchronous clock generator circuit 500 includes certain common components with the asynchronous clock generator circuit 400 in FIG. 4 as shown by common element numbers between FIGS. 4 and 5, and thus will not be re-described herein. However, the asynchronous clock generator circuit 500 also employs alternative circuit elements compared to the asynchronous clock generator circuit 400.

With reference to FIG. 5, the outside-window comparator circuit 114 includes an exemplary version of the high comparator 402 and the low comparator 404. The high comparator 402 includes a p-type MOS (PMOS) transistor 502, an inverter 504, and a current sink 506. In this manner, the output voltage signal ($V_{CMP}$) is provided to a gate of the PMOS transistor 502, a source of the PMOS transistor 502 is electrically coupled to a voltage source (VDD), and a drain of the PMOS transistor 502 is electrically coupled to the current sink 506. The high threshold voltage ($V_{TH}$) is set by the threshold voltage of the PMOS transistor 502. Thus, the output voltage signal ($V_{CMP}$) having a voltage less than the high threshold voltage ($V_{TH}$) activates the PMOS transistor 502 such that the source voltage (VDD) is provided to the inverter 504. This results in providing the high limit signal (HIGH) being in an inactive state (e.g., a logic low "0" state) to the OR-based logic circuit 406. In contrast, the output voltage signal ($V_{CMP}$) having a voltage greater than the high threshold voltage ($V_{TH}$) deactivates the PMOS transistor 502 such that the current sink 506 drives the input of the inverter 504 to ground. As a result, the inverter 504 provides the high limit signal (HIGH) being in an active state (e.g., a logic high "1" state) to the OR-based logic circuit 406.

With continuing reference to FIG. 5, the low comparator 404 includes an NMOS transistor 508, inverters 510, 512, and a current source 514. In this manner, the output voltage signal ($V_{CMP}$) is provided to a gate of the NMOS transistor 508, a source of the NMOS transistor 508 is electrically coupled to ground, and a drain of the NMOS transistor 508 is electrically coupled to the current source 514. The low threshold voltage ($V_{TL}$) is set by the threshold voltage of the NMOS transistor 508. Thus, the output voltage signal ($V_{CMP}$) having a voltage greater than the low threshold voltage ($V_{TL}$) activates the NMOS transistor 508 such that an input of the inverter 510 is driven to ground. This results in the inverter 510 providing an active state (e.g., a logic high "1" state) to the inverter 512, which provides the low limit signal (LOW) being in an inactive state (e.g., a logic low "0" state) to the OR-based logic circuit 406. In contrast, the output voltage signal ($V_{CMP}$) having a voltage less than the low threshold voltage ($V_{TL}$) deactivates the NMOS transistor 508 such that the current source 514 drives the input of the inverter 510 to the source voltage (VDD). As a result, the inverter 510 provides an inactive state (e.g., a logic low "0" state) to the inverter 512, which provides the low limit signal (LOW) being in an active state (e.g., a logic high "1" state) to the OR-based logic circuit 406. Further, it is worth noting that to achieve the functionality in this aspect, the sum of the threshold voltages for the PMOS transistor 502 and the NMOS transistor 508 is less than the source voltage (VDD). In particular, the magnitude of the voltage window used by the outside-window comparator circuit 114 is equal to the source voltage (VDD) minus the sum of the threshold voltages for the PMOS transistor 502 and the NMOS transistor 508. Thus, setting the threshold voltages of the PMOS transistor 502 and the NMOS transistor 508 such that the sum of the threshold voltages is less than the supply voltage (VDD) allows the outside-window comparator circuit 114 to generate the outside-window signal (OUTSIDE-WINDOW) as described above.

With continuing reference to FIG. 5, the edge delayer circuit 120 and the pulse generator circuit 122 each include alternative circuit elements as compared to the aspect described in FIG. 4. In this manner, rather than including the buffer 412 and the resistor circuit 418 as illustrated in FIG. 4, the edge delayer circuit 120 in FIG. 5 includes a current source 516. Thus, in response to the trigger signal (TRIGGER) being in an inactive state (e.g., a logic low "0" state), the inverter 414 provides a logic high "1" state to the NMOS transistor 416. This electrically couples the capacitor circuit 420 and the current source 516 to ground, which provides a logic low "0" state to the AND-based logic circuit 426 and causes the edge signal (EDGE) to have an inactive state (e.g., a logic low "0" state). In contrast, in response to the trigger signal (TRIGGER) being in an active state (e.g., a logic high "1" state), the inverter 414 provides a logic low "0" state to the NMOS transistor 416 such that the NMOS transistor 416 deactivates. Further, because the capacitor circuit 420 is not electrically coupled to ground, the current source 516 provides current to charge the capacitor circuit 420. In response to the capacitor circuit 420 charging for the minimum time ($T_D$), a voltage corresponding to the current source 516 and the capacitor circuit 420 causes the gain circuit 422 to provide a logic high "1" state to the AND-based logic circuit 426, thus generating the edge signal (EDGE) in response to the trigger signal (TRIGGER) being in an active state for the minimum time ($T_D$).

Additionally, rather than including the resistor circuit 436 and the second inverter 432 in FIG. 4, the pulse generator circuit 122 in FIG. 5 includes a current source 518. In this manner, in response to the first inverter 430 providing a logic high "1" state to the NMOS transistor 434 (e.g., in response to the asynchronous clock signal being in a logic low "0" state), the capacitor circuit 438 and the reset inverter 440 are electrically coupled to ground such that the flip-flop circuit 428 does not reset. Alternatively, in response to the first inverter 430 providing a logic low "0" state to the NMOS transistor 434 (e.g., in response to the asynchronous clock signal being in a logic high "1" state), the NMOS transistor 434 deactivates such that the current source 518 charges the capacitor circuit 438. Following a time equivalent to the pulse width ($T_{PW}$), the capacitor circuit 438 and the current source 518 provide a logic high "1" state to the reset inverter 440. The logic high "1" state causes the reset inverter 440 to provide the reset signal being in a logic low "0" state to the reset bar input (RB) of the flip-flop circuit 428, thus resetting the asynchronous clock signal (ASYNCH CLOCK) on the data output (Q).

While the aspects of the asynchronous clock generator circuit described above are configured to adaptively generate the asynchronous clock signal, other aspects can include a time-out feature designed to generate the asynchronous clock signal following an extended period of inactivity. Providing such a time-out feature in an asynchronous clock generation circuit for a SAR ADC may avoid stalls resulting from the asynchronous clock signal failing to generate.

Figure 6:
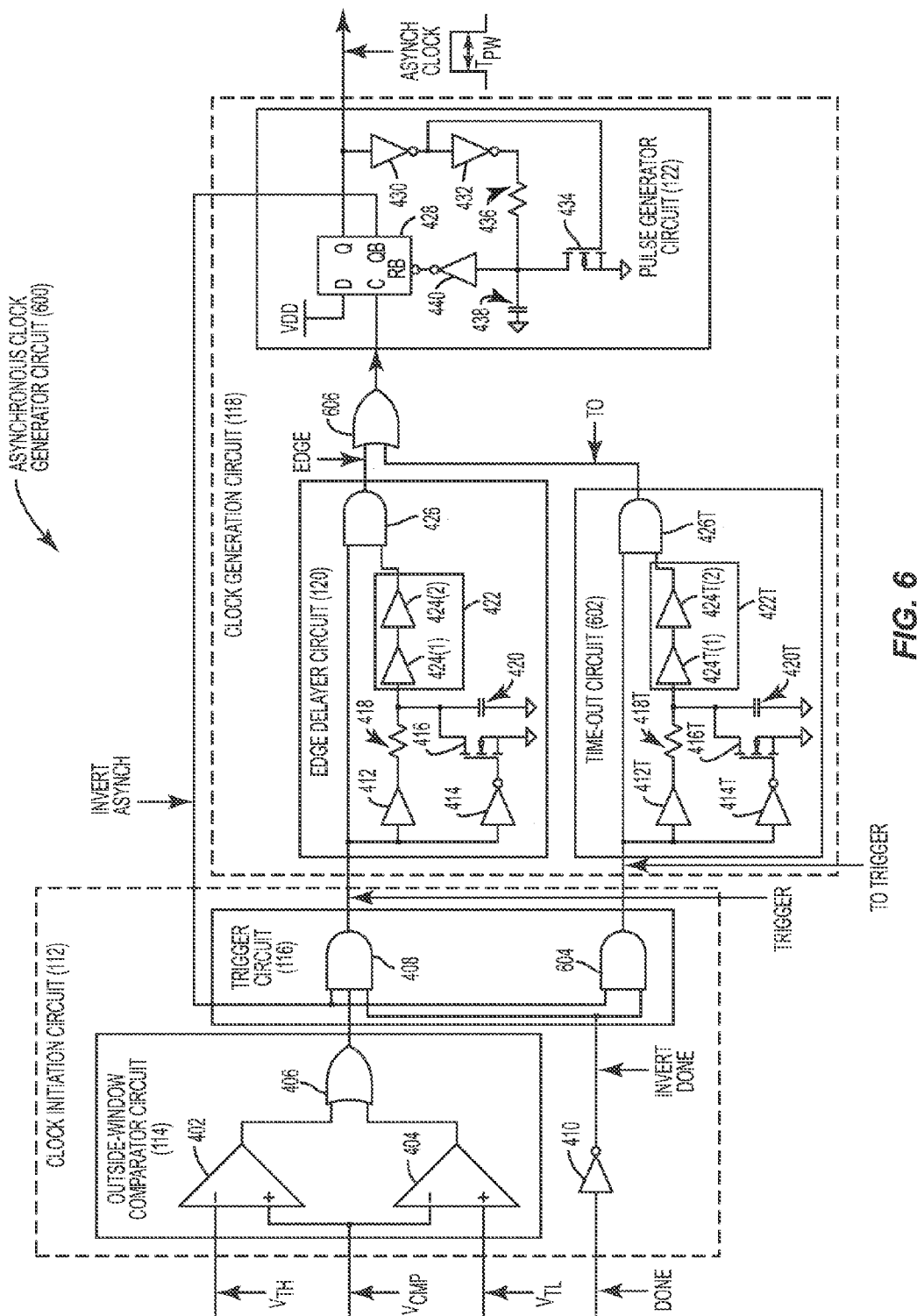
FIG. 6 is a circuit diagram of another exemplary asynchronous clock generator circuit that can be provided in the SAR ADC in FIG. 1A, wherein the asynchronous clock generator circuit includes a time-out circuit configured to trigger an asynchronous clock signal after the asynchronous clock signal is in an inactive state for a maximum time.

In this regard, FIG. 6 illustrates an exemplary asynchronous clock generator circuit 600 that employs a time-out circuit 602. The asynchronous clock generator circuit 600 can be employed in the asynchronous clock generator circuit 102 in FIG. 1B. The time-out circuit 602 is configured to generate a time-out signal (TO) in response to the asynchronous clock signal (ASYNCH CLOCK) being in an inactive state for a maximum time ($T_{MAX}$). Further, the pulse generator circuit 122 is configured to generate the asynchronous clock signal (ASYNCH CLOCK) in response to the time-out signal (TO). The time-out circuit 602 in this example includes similar elements as the edge delayer circuit 120 in FIG. 4, which are shown in FIG. 6 with the element number in FIG. 4 appended with a "T" (e.g., the resistor circuit 418T).

With continuing reference to FIG. 6, the trigger circuit 116 includes an AND-based logic circuit 604 (e.g., an AND gate or a NAND gate) configured to provide a time-out trigger signal (TO TRIGGER) to the time-out circuit 602 in response to the inverted done signal (INVERT DONE) and the inverted asynchronous clock signal (INVERT ASYNCH). Thus, during a conversion process of the SAR ADC 100 in FIG. 1 (e.g., DONE being in a logic low "0" state), the AND-based logic circuit 604 generates the time-out trigger signal (TO TRIGGER) in response to the inverted asynchronous clock signal (INVERT ASYNCH) being in an active state (e.g., a logic high "1" state). Similar to the function described in relation to the edge delayer circuit 120 in FIG. 4, the capacitor circuit 420T (e.g., the capacitor 420T in this aspect) charges in response to the time-out trigger signal (TO TRIGGER). The capacitor circuit 420T fully charges after the maximum time ($T_{MAX}$) such that current from the resistor circuit 418T (e.g., a resistor 418T in this aspect), in conjunction with the timeout trigger signal (TO TRIGGER), causes the AND-based logic circuit 426T to generate the time-out signal (TO). In other words, the RC delay of the resistor circuit 418T and the capacitor circuit 420T is equivalent to the maximum time ($T_{MAX}$). The time-out signal (TO) and the edge signal (EDGE) are provided to an OR-based logic circuit 606 (e.g., an OR gate or a NOR gate). In this manner, the asynchronous clock signal (ASYNCH CLOCK) is generated in response to either the edge signal (EDGE) or the time-out signal (TO) being in an active state (e.g., a logic high "1" state). Thus, the time-out circuit 602 is configured to generate the asynchronous clock signal following an extended period of inactivity so as to avoid stalls caused by the asynchronous clock signal.

Figure 7:
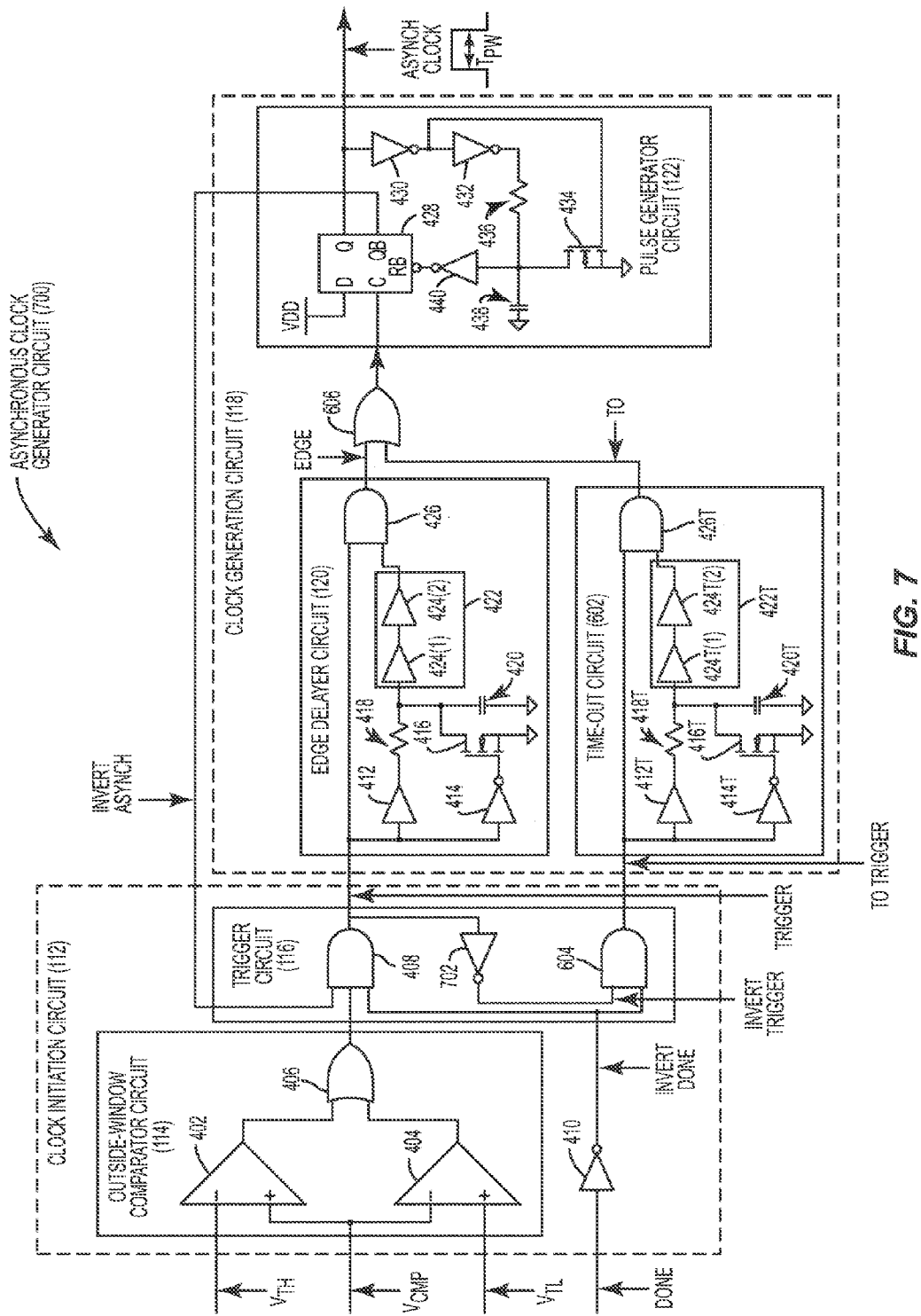
FIG. 7 is a circuit diagram of another exemplary asynchronous clock generator circuit that can be provided in the SAR ADC in FIG. 1A, wherein the asynchronous clock generator circuit includes a time-out circuit configured to trigger an asynchronous clock signal after the trigger signal is in an inactive state for the maximum time.

As an alternative to the time-out circuit 602 configured to generate the time-out signal (TO) based on the asynchronous clock signal (ASYNCH CLOCK), the time-out circuit 602 can be configured to generate the time-out signal (TO) in response to inactivity of the trigger signal (TRIGGER). In this regard, FIG. 7 illustrates an exemplary asynchronous clock generator circuit 700 employing the time-out circuit 602. The asynchronous clock generator circuit 700 includes similar elements as the asynchronous clock generator circuit 600 in FIG. 6 as shown by common element numbers between FIGS. 6 and 7, and thus will not be re-described herein. However, to cause the time-out circuit 602 in FIG. 7 to be responsive to inactivity of the trigger signal (TRIGGER), the trigger signal (TRIGGER) is provided to an inverter 702 in the trigger circuit 116. The inverter 702 provides an inverted trigger signal (INVERT TRIGGER) to the AND-based logic circuit 604. In this manner, the time-out circuit 602 generates the time-out signal (TO) in response to the inverted trigger signal (INVERT TRIGGER) being in an active state (e.g., a logic high "1" state) for the maximum time ($T_{MAX}$) (i.e., the trigger signal (TRIGGER) being in an inactive state (e.g., a logic low "0" state) for the maximum time ($T_{MAX}$)).

As previously noted, other aspects can achieve functionality similar to the aspects described above using alternative circuit elements, and thus, aspects are not limited to the circuit elements provided herein.

Further, the elements described herein are sometimes referred to as means for performing particular functions. In this regard, the outside-window comparator circuit 114 is sometimes referred to herein as a means for receiving the output voltage signal ($V_{CMP}$) generated by the comparator circuit 110 in the SAR ADC 100. The outside-window comparator circuit 114 is also sometimes referred to herein as a means for generating the outside-window signal (OUTSIDE-WINDOW) in response to the output voltage signal ($V_{CMP}$) being outside of the voltage threshold window (VTW). The trigger circuit 116 is sometimes referred to herein as a means for generating the trigger signal (TRIGGER) in response to the outside-window signal (OUTSIDE-WINDOW) and the asynchronous clock signal (ASYNCH CLOCK). Further, the edge delayer circuit 120 is sometimes referred to herein as a means for generating the edge signal (EDGE) in response to the trigger signal (TRIGGER) being in an active state for the minimum time ($T_D$). Further, the pulse generator circuit 122 is sometimes referred to herein as a means for generating the asynchronous clock signal (ASYNCH CLOCK) having a pulse width ($T_{PW}$) in response to the edge signal (EDGE).

The asynchronous clock generator circuits for generating asynchronous clock signals for SAR ADCs according to aspects disclosed herein may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a server, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 8:
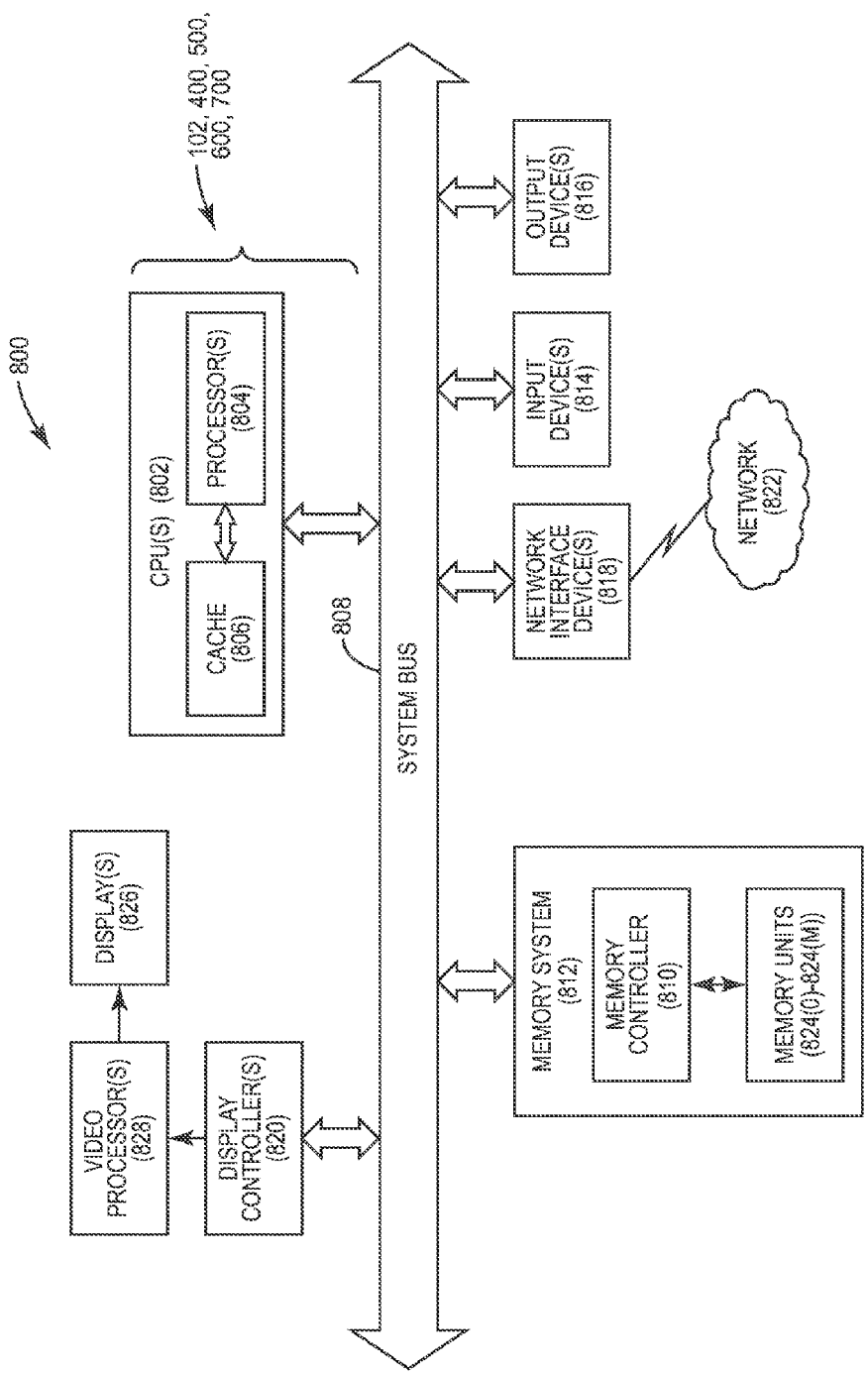
FIG. 8 is a block diagram of an exemplary processor-based system that can include a SAR ADC employing an asynchronous clock generator circuit, including the asynchronous clock generator circuits in FIGS. 1B, 4, 5, 6, and 7 for generating an asynchronous clock signal for the SAR ADC in FIG. 1A.

In this regard, FIG. 8 illustrates an example of a processor-based system 800 that includes elements that can employ the SAR ADC 100 in FIG. 1A that include the asynchronous clock generator circuits 102, 400, 500, 600, and 700 illustrated in FIGS. 1B and 4-7, respectively. In this example, the processor-based system 800 includes one or more central processing units (CPUs) 802, each including one or more processors 804. The CPU(s) 802 may have cache memory 806 coupled to the processor(s) 804 for rapid access to temporarily stored data. The CPU(s) 802 is coupled to a system bus 808 and can intercouple master and slave devices included in the processor-based system 800. As is well known, the CPU(s) 802 communicates with these other devices by exchanging address, control, and data information over the system bus 808. For example, the CPU(s) 802 can communicate bus transaction requests to a memory controller 810 as an example of a slave device. Although not illustrated in FIG. 8, multiple system buses 808 could be provided, wherein each system bus 808 constitutes a different fabric.

Other master and slave devices can be connected to the system bus 808. As illustrated in FIG. 8, these devices can include a memory system 812, one or more input devices 814, one or more output devices 816, one or more network interface devices 818, and one or more display controllers 820, as examples. The input device(s) 814 can include any type of input device, including, but not limited to, input keys, switches, voice processors, etc. The output device(s) 816 can include any type of output device, including, but not limited to, audio, video, other visual indicators, etc. The network interface device(s) 818 can be any device configured to allow exchange of data to and from a network 822. The network 822 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 818 can be configured to support any type of communications protocol desired. The memory system 812 can include one or more memory units 824(0)-824(M).

The CPU(s) 802 may also be configured to access the display controller(s) 820 over the system bus 808 to control information sent to one or more displays 826. The display controller(s) 820 sends information to the display(s) 826 to be displayed via one or more video processors 828, which process the information to be displayed into a format suitable for the display(s) 826. The display(s) 826 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. An asynchronous clock generator circuit for generating an asynchronous clock signal for a successive approximation register (SAR) analog to digital converter (ADC), comprising:
   a clock initiation circuit, comprising:
      an outside-window comparator circuit configured to:
         receive an output voltage signal generated by a comparator circuit in a SAR ADC; and
         generate an outside-window signal in response to the output voltage signal being outside of a voltage threshold window; and
      a trigger circuit configured to generate a trigger signal in response to the outside-window signal and an asynchronous clock signal; and
   a clock generation circuit, comprising:
      an edge delayer circuit configured to generate an edge signal in response to the trigger signal being in an active state for a minimum time; and
      a pulse generator circuit configured to generate the asynchronous clock signal having a pulse width in response to the edge signal.

2. The asynchronous clock generator circuit of claim 1, wherein the outside-window comparator circuit is further configured to generate the outside-window signal in response to the output voltage signal having a voltage greater than a high threshold voltage of the voltage threshold window.

3. The asynchronous clock generator circuit of claim 2, wherein the outside-window comparator circuit is further configured to generate the outside-window signal in response to the output voltage signal having a voltage less than a low threshold voltage of the voltage threshold window.

4. The asynchronous clock generator circuit of claim 3, wherein the outside-window comparator circuit comprises:
   a high comparator configured to:
      receive the output voltage signal and the high threshold voltage; and
      generate a high limit signal in response to the output voltage signal having a voltage greater than the high threshold voltage;
   a low comparator configured to:
      receive the output voltage signal and the low threshold voltage; and
      generate a low limit signal in response to the output voltage signal having a voltage less than the low threshold voltage; and
   an OR-based logic circuit configured to:
      receive the high limit signal and the low limit signal; and
      generate the outside-window signal.

5. The asynchronous clock generator circuit of claim 1, wherein the trigger circuit is further configured to generate the trigger signal in response to the outside-window signal being in an active state and the asynchronous clock signal being in an inactive state.

6. The asynchronous clock generator circuit of claim 5, wherein the trigger circuit is further configured to:
   receive a done signal indicating that the SAR ADC is not performing a conversion process; and
   generate the trigger signal in response to the outside-window signal being in an active state, the asynchronous clock signal being in an inactive state, and the done signal being in an inactive state.

7. The asynchronous clock generator circuit of claim 6, wherein the trigger circuit comprises an AND-based logic circuit configured to:
   receive the outside-window signal, an inverted done signal, and an inverted asynchronous clock signal, wherein the inverted done signal is an inverse of the done signal and the inverted asynchronous clock signal is an inverse of the asynchronous clock signal; and
   generate the trigger signal.

8. The asynchronous clock generator circuit of claim 1, wherein the edge delayer circuit is further configured to:
   increase a time count in response to the trigger signal being in an active state;
   generate the edge signal in response to the time count being equal to the minimum time; and
   reset the time count in response to the trigger signal transitioning to an inactive state.

9. The asynchronous clock generator circuit of claim 1, wherein the edge delayer circuit comprises:
   an n-type metal oxide semiconductor (NMOS) transistor comprising:
      a gate configured to receive an inverted trigger signal, wherein the inverted trigger signal is an inverse of the trigger signal;
      a drain; and
      a source electrically coupled to ground;

a capacitor circuit, comprising:
   a first node electrically coupled to the drain of the NMOS transistor; and
   a second node electrically coupled to ground;
a resistor circuit, comprising:
   a first node configured to receive the trigger signal; and
   a second node electrically coupled to the drain of the NMOS transistor and the first node of the capacitor circuit; and
an AND-based logic circuit, configured to:
   receive the trigger signal and a voltage corresponding to a resistor-capacitor (RC) circuit formed by the resistor circuit and the capacitor circuit; and
   generate the edge signal.

10. The asynchronous clock generator circuit of claim 1, wherein the pulse generator circuit is further configured to generate the asynchronous clock signal in response to an active transition of the edge signal.

11. The asynchronous clock generator circuit of claim 10, wherein the pulse generator circuit comprises:
a flip-flop circuit, comprising:
   a data input configured to receive a source voltage;
   a clock input configured to receive the edge signal;
   a reset bar input; and
   a data output;
the flip-flop circuit configured to:
   generate the asynchronous clock signal on the data output in response to an active transition of the edge signal; and
   reset the asynchronous clock signal on the data output in response receiving a reset signal on the reset bar input;
a capacitor circuit, comprising a first node and a second node;
an n-type metal oxide semiconductor (NMOS) transistor, comprising:
   a gate configured to receive an inverted asynchronous clock signal, wherein the inverted asynchronous clock signal is an inverse of the asynchronous clock signal;
   a drain; and
   a source electrically coupled to ground;
a resistor circuit, comprising:
   a first node configured to receive the asynchronous clock signal; and
   a second node electrically coupled to the first node of the capacitor circuit and the drain of the NMOS transistor; and
a reset inverter, comprising:
   an input configured to receive a voltage corresponding to a resistor-capacitor (RC) circuit formed by the resistor circuit and the capacitor circuit; and
   an output configured to provide the reset signal to the reset bar input.

12. The asynchronous clock generator circuit of claim 1, further comprising:
a time-out circuit configured to generate a time-out signal in response to the asynchronous clock signal being in an inactive state for a maximum time; and
the pulse generator circuit further configured to generate the asynchronous clock signal in response to the time-out signal.

13. The asynchronous clock generator circuit of claim 12, wherein the time-out circuit is further configured to generate the time-out signal in response to an inverted asynchronous clock signal being in an active state for the maximum time, wherein the inverted asynchronous clock signal is an inverse of the asynchronous clock signal.

14. The asynchronous clock generator circuit of claim 12, wherein the time-out circuit is further configured to generate the time-out signal in response to an inverted trigger signal being in an active state for the maximum time, wherein the inverted trigger signal is an inverse of the trigger signal.

15. The asynchronous clock generator circuit of claim 1 integrated into an integrated circuit (IC).

16. The asynchronous clock generator circuit of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a server; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

17. An asynchronous clock generator circuit for generating an asynchronous clock signal for a successive approximation register (SAR) analog to digital converter (ADC), comprising:
a means for receiving an output voltage signal generated by a comparator circuit in a SAR ADC;
a means for generating an outside-window signal in response to the output voltage signal being outside of a voltage threshold window;
a means for generating a trigger signal in response to the outside-window signal and an asynchronous clock signal;
a means for generating an edge signal in response to the trigger signal being in an active state for a minimum time; and
a means for generating the asynchronous clock signal having a pulse width in response to the edge signal.

18. A method for generating an asynchronous clock signal for a successive approximation register (SAR) analog to digital converter (ADC), comprising:
receiving an output voltage signal generated by a comparator circuit in a SAR ADC;
generating an outside-window signal in response to the output voltage signal being outside of a voltage threshold window;
generating a trigger signal in response to the outside-window signal and an asynchronous clock signal;
generating an edge signal in response to the trigger signal being in an active state for a minimum time; and
generating the asynchronous clock signal having a pulse width in response to the edge signal.

19. The method of claim 18, wherein generating the outside-window signal comprises generating the outside-window signal in response to the output voltage signal having a voltage greater than a high threshold voltage of the voltage threshold window.

20. The method of claim 18, wherein generating the outside-window signal further comprises generating the outside-window signal in response to the output voltage signal having a voltage less than a low threshold voltage of the voltage threshold window.

21. The method of claim 18, further comprising generating the trigger signal in response to the outside-window signal being in an active state and the asynchronous clock signal being in an inactive state.

22. The method of claim 18, further comprising:
increasing a time count in response to the trigger signal being in an active state;
generating the edge signal in response to the time count being equal to the minimum time; and
resetting the time count in response to the trigger signal transitioning to an inactive state.

23. The method of claim 18, further comprising generating the asynchronous clock signal in response to an active transition of the edge signal.

24. The method of claim 18, further comprising:
generating a time-out signal in response to the asynchronous clock signal being in an inactive state for a maximum time; and
generating the asynchronous clock signal in response to the time-out signal.

25. A successive approximation register (SAR) analog to digital converter (ADC), comprising:
a comparator circuit;
a digital to analog converter (DAC);
a SAR circuit configured to be clocked by an asynchronous clock signal; and
an asynchronous clock generator circuit, comprising:
a clock initiation circuit, comprising:
an outside-window comparator circuit configured to:
receive an output voltage signal generated by the comparator circuit; and
generate an outside-window signal in response to the output voltage signal being outside of a voltage threshold window; and
a trigger circuit configured to generate a trigger signal in response to the outside-window signal and the asynchronous clock signal; and
a clock generation circuit, comprising:
an edge delayer circuit configured to generate an edge signal in response to the trigger signal being in an active state for a minimum time; and
a pulse generator circuit configured to generate the asynchronous clock signal having a pulse width in response to the edge signal.

26. The SAR ADC of claim 25, wherein the outside-window comparator circuit is further configured to generate the outside-window signal in response to the output voltage signal having a voltage greater than a high threshold voltage of the voltage threshold window.

27. The SAR ADC of claim 26, wherein the outside-window comparator circuit is further configured to generate the outside-window signal in response to the output voltage signal having a voltage less than a low threshold voltage of the voltage threshold window.

28. The SAR ADC of claim 25, wherein the trigger circuit is further configured to generate the trigger signal in response to the outside-window signal being in an active state and the asynchronous clock signal being in an inactive state.

29. The SAR ADC of claim 25, wherein the edge delayer circuit is further configured to:
increase a time count in response to the trigger signal being in an active state; and
generate the edge signal by being configured to generate the edge signal in response to the time count being equal to the minimum time;
reset the time count in response to the trigger signal transitioning to an inactive state.

30. The SAR ADC of claim 25, wherein the pulse generator circuit is further configured to generate the asynchronous clock signal in response to an active transition of the edge signal.

\* \* \* \* \*